(12) United States Patent
Wilcoxen et al.

(10) Patent No.: US 8,035,226 B1
(45) Date of Patent: Oct. 11, 2011

(54) WAFER LEVEL PACKAGE INTEGRATED CIRCUIT INCORPORATING SOLDER BALLS CONTAINING AN ORGANIC PLASTIC-CORE

(75) Inventors: Duane T. Wilcoxen, Dallas, TX (US);
Christo P. Bojkov, Plano, TX (US);
Ajay Kumar Ghai, San Jose, CA (US);
Steve Detlev Cate, Los Altos, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 493 days.

(21) Appl. No.: 12/134,026

(22) Filed: Jun. 5, 2008

(51) Int. Cl.
*H01L 23/48* (2006.01)
(52) U.S. Cl. ........... 257/738; 257/737; 257/E23.021; 257/E23.069
(58) Field of Classification Search ........... 257/737, 257/738, 780–782, 784, E23.021, E23.069; 438/612–617
See application file for complete search history.

(56) References Cited

U.S. PATENT DOCUMENTS

| 6,362,087 | B1 * | 3/2002 | Wang et al. | 438/597 |
| 7,338,891 | B2 * | 3/2008 | Jeong | 438/614 |
| 2006/0226545 | A1 * | 10/2006 | Suminoe et al. | 257/738 |

* cited by examiner

*Primary Examiner* — Jasmine Clark
(74) *Attorney, Agent, or Firm* — Advent IP, P.C., L.L.C.

(57) ABSTRACT

An integrated circuit including solder balls containing an elastic or resilient material core, a hard or rigid shell substantially enclosing the core, and an electrical contact layer substantially enclosing the shell. The elastic or resilient core serves as a stress buffer layer in a wafer level package (WLP) integrated circuit. The elastic or resilient material core may include an organic plastic material, such as a Divinilbenzene cross-linked co-polymer of relatively high resistance. This material has a relatively good elongation property so that it can effectively absorb forces exerted upon the integrated circuit by, for example, the flexing of a printed circuit board (PCB) or other structure to which the integrated circuit is attached. The hard or rigid shell serves to contain the elastic or resilient core and may include copper. The electrical contact layer serve to provide a good adhesive electrical contact to an under bump metallization (UBM) layer, may include a lead free, Tin-Gold (SnAg) material.

24 Claims, 5 Drawing Sheets

WAFER LEVEL PACKAGE INTEGRATED CIRCUIT INCORPORATING SOLDER BALLS CONTAINING AN ORGANIC PLASTIC-CORE

FIELD OF THE INVENTION

This invention relates generally to integrated circuits, and in particular, to an integrated circuit comprising solder balls including an organic plastic-core that serves as a stress buffer layer in wafer level package (WLP) integrated circuits.

BACKGROUND OF THE INVENTION

Integrated circuits are continuously undergoing development to provide smaller footprints while providing the same or higher circuit densities. Additionally, the packaging of integrated circuit is also continuously undergoing development to provide packages only slightly larger than the integrated circuits they are housing. For instance, integrated circuit packages using wire bonds connected to a lead frame, that typically require a relatively large footprint, are generally being replaced with chip scale packages (CSP), such as wafer level packages (WLP), wherein the size of the package is substantially the same or slightly larger than the integrated circuit it houses.

In a typical wafer level package (WLP), solder balls are attached to an integrated circuit such that the solder balls are electrically connected to the respective bond pads of the integrated circuit. In one implementation, the solder balls are electrically connected to bond pads by way of only an under bump metallurgy (UBM) layer. This is typically referred to as the bump on pad (BOP) implementation. In another implementation, solder balls are electrically connected to bond pads by way of the UBM layer and a redistribution layer (RDL). The redistribution layer (RDL) allows the pattern of the solder bumps to be different than the pattern of the bond pads of the integrated circuits.

In some packaging configurations, such as in flip chips, the integrated circuit is typically flipped up-side-down so that the solder bumps face downward, and placed on a printed circuit board (PCB). The integrated circuit and PCB are then heated to reflow the solder, thereby electrically attaching the solder balls to electrical contacts on the PCB. The PCB is typically made out of a generally flexible substrate. During manufacturing, handling, and operation, the flexible substrate bends and absorbs much of the forces to which it is subjected. However, the bending of the flexible substrate creates stress around the region where the solder balls attach to the integrated circuit. Sometimes the stress causes permanent damage to the integrated circuit.

SUMMARY OF THE INVENTION

An aspect of the invention relates to using solder balls containing an elastic or resilient material core, a hard or rigid shell substantially enclosing the core, and an electrical contact layer substantially enclosing the shell. The elastic or resilient core serves as a stress buffer layer in a wafer level package (WLP) integrated circuit. Each elastic or resilient material core may include an organic-plastic material, such as Divinilbenzene cross-linked co-polymer of relatively high resistance. It has a relatively good elongation property so that it can effectively absorb forces exerted on the integrated circuit by, for example, the flexing of a printed circuit board (PCB) or other structure to which the integrated circuit is attached. The organic-plastic material also has a relatively high strength property to protect the integrated circuit from external forces. Thus, the solder balls can further assist in effectively protecting the integrated circuit during manufacturing, handling, and operation.

In one exemplary embodiment, an integrated circuit comprises a substrate, a bond pad disposed over the substrate, and a dielectric or passivation layer disposed over the substrate and the bond pad. The integrated circuit further comprises an under bump metallization (UBM) layer disposed over the dielectric substrate, and over the bond pad by way of an opening through the dielectric layer. The integrated circuit further comprises a solder ball situated over the UBM layer to make electrical contact to the bond pad. As previously discussed, the solder ball comprises an elastic or resilient material core (e.g., Divinilbenzene cross-linked co-polymer), a hard or rigid shell (e.g., Cu) substantially enclosing the core, and an electrical contact layer (e.g., Sn—Ag) substantially enclosing the shell.

In another exemplary embodiment, an integrated circuit comprises a substrate, a bond pad disposed over the substrate, and a dielectric or passivation layer disposed over the substrate and the bond pad. The integrated circuit further comprises a redistribution layer (RDL) disposed over the dielectric layer, and over the bond pad by way of an opening through the dielectric layer. Additionally, the integrated circuit comprises a second dielectric layer disposed over the RDL and the first dielectric layer, a UBM layer disposed over the RDL by way of an opening through the second dielectric layer, and a solder ball disposed over the UBM layer. The solder ball makes electrical contact to the bond pad by way of the UBM layer and the RDL. As previously discussed, the solder ball comprises an elastic or resilient material core (e.g., Divinilbenzene cross-linked co-polymer), a hard or rigid shell (e.g., Cu) substantially enclosing the core, and an electrical contact layer (e.g., Sn—Ag) substantially enclosing the shell.

In yet another exemplary embodiment, an integrated circuit comprises a substrate, a bond pad disposed over the substrate, and a dielectric or passivation layer disposed over the substrate and the bond pad. The integrated circuit also comprises a stress relief layer (e.g., PolyBenzOxazole (PBO), Benzocyclobutene (BCB), or Polyimide) disposed on the dielectric layer. Additionally, the integrated circuit comprises a UBM layer disposed over the stress relief and dielectric layers, and over the bond pad by way of respective openings through the stress relief and dielectric layers. The integrated circuit further comprises a solder ball situated over the UBM layer to make electrical contact to the bond pad. As previously discussed, the solder ball comprises an elastic or resilient material core (e.g., Divinilbenzene cross-linked co-polymer), a hard or rigid shell (e.g., Cu) substantially enclosing the core, and an electrical contact layer (e.g., Sn—Ag) substantially enclosing the shell.

In still another exemplary embodiment, an integrated circuit comprises a substrate, a bond pad disposed over the substrate, a dielectric or passivation layer disposed over the substrate and the bond pad, and a first stress relief layer disposed over the dielectric layer. The integrated circuit further comprises an RDL disposed over the first stress relief and dielectric layers, and over the bond pad by way of respective openings through the first stress relief and dielectric layers. Additionally, the integrated circuit comprises a second stress relief layer disposed over the RDL and the first stress relief layer, a UBM layer disposed over the RDL by way of an opening through the second stress relief layer, and a solder ball disposed over the UBM layer. The solder ball makes electrical contact to the bond pad by way of the UBM layer and the RDL. As previously discussed, the solder ball comprises an elastic or resilient material core (e.g., Divinilbenzene cross-linked co-polymer), a hard or rigid shell (e.g., Cu) substantially enclosing the core, and an electrical contact layer (e.g., Sn—Ag) substantially enclosing the shell.

Continuing, in accordance with another exemplary embodiment, an integrated circuit comprises a substrate, a bond pad disposed over the substrate, a dielectric or passivation layer disposed over the substrate and the bond pad, and a first stress relief layer disposed over the dielectric layer. The integrated circuit further comprises a redistribution layer (RDL) disposed over the first stress relief and dielectric layers, and over the bond pad by way of respective openings through the first stress relief and dielectric layers. Additionally, the integrated circuit comprises a UBM layer disposed over the RDL, and a second stress relief layer disposed over the RDL, UBM layer, and first stress relief layer. Further, the integrated circuit further comprises a solder ball disposed over the UBM layer by way of an opening through the second stress relief layer. The solder ball makes electrical contact to the bond pad by way of the UBM layer and the RDL. As previously discussed, the solder ball comprises an elastic or resilient material core (e.g., Divinilbenzene cross-linked co-polymer), a hard or rigid shell (e.g., Cu) substantially enclosing the core, and an electrical contact layer (e.g., Sn—Ag) substantially enclosing the shell.

Other aspects, advantages and novel features of the present invention will become apparent from the following detailed description of the invention when considered in conjunction with the accompanying drawings.

DETAILED DESCRIPTION OF THE EXEMPLARY EMBODIMENTS

Figure 1:
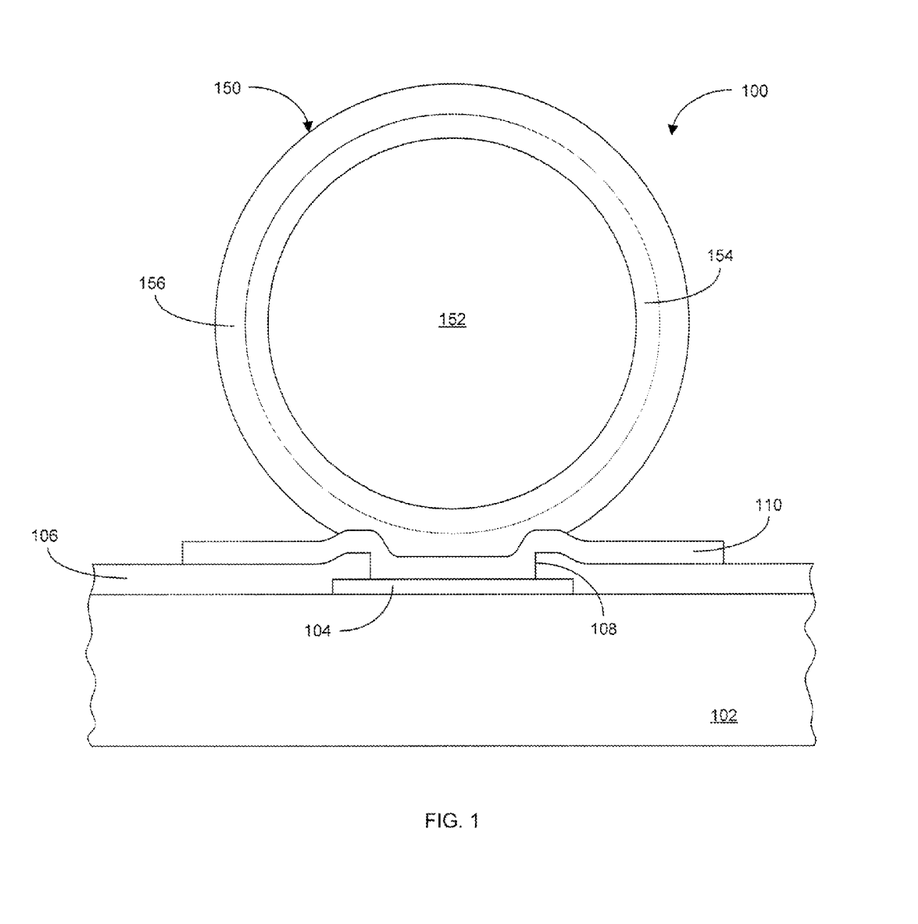
FIG. 1 illustrates a sectional view of an exemplary integrated circuit in accordance with an embodiment of the invention.

FIG. 1 illustrates a sectional view of an exemplary integrated circuit 100 in accordance with an embodiment of the invention. The integrated circuit 100 is an example of a bump on pad (BOP) implementation having a solder ball with an organic-plastic core that serves as a stress buffer layer. In this example, a single bond pad and respective solder bump are used to exemplify the invention. It shall be understood that the integrated circuit 100 may have a plurality of bond pads and respective solder balls in the configuration described herein.

In particular, the integrated circuit 100 comprises a semiconductor substrate 102 (e.g., a silicon substrate) including one or more active devices. The integrated circuit 100 further comprises at least one bond pad 104 for electrically connecting the integrated circuit to external components. The bond pad 104 is disposed over the substrate 102, and may comprise any suitable electrical conductor, such as aluminum, copper, aluminum alloy, copper alloy, and others.

The integrated circuit 100 further comprises a dielectric layer 106 serving as a passivation layer for the substrate 102. The dielectric layer 106 is disposed over the substrate 102, and includes an opening 108 to expose at least a portion of the top surface of the bond pad 104. The dielectric layer 106 may be comprised of any suitable dielectric material, such as oxides (e.g., $SiO_2$), nitrides (e.g., $Si_3N_4$), and others.

The integrated circuit 100 further comprises an under bump metallization (UBM) layer 110 to provide a relatively good electrical contact to a solder ball 150 and the bond pad 104. The UBM layer 110 is disposed over the dielectric layer 106 and the bond pad 104 through the opening 108 of the dielectric layer 106. The UBM layer 110 may be comprised of any suitable electrical conductor that provides a good adhesive contact to the solder ball 150 and to the bond pad 104. As an example, the UBM layer 110 may comprise multiple layers, such as Titanium-Tungsten-Nickel-Vanadium-Copper (Ti—W—Ni—V—Cu). As another example, the UBM layer 110 may comprise a copper mini bump which may be formed by electroplating a seed layer of copper.

The solder ball 150 is formed over the UBM layer 110. The solder ball 150 comprises a core 152 made out of an elastic or resilient material serving as a stress relief material for the integrated circuit 100. The elastic or resilient core 152 helps protect the integrated circuit 100 against mechanical and/or thermal stress due to manufacturing, handling, and usage in general. In the exemplary embodiment, the elastic or resilient core 152 comprises an organic plastic core. As an example, the core 152 may be made out of a Divinilbenzene cross-linked co-polymer of relatively high resistance. The core 152 may have a general diameter of approximately 100 to 350 micrometers, and preferably about 280 micrometers. Although the elastic or resilient material has been described herein as the core of the solder ball 150, it shall be understood that the elastic or resilient material need not be situated at the core, but may be one or more layers situated within the solder ball 150.

The solder ball 150 further comprises a relatively hard or rigid shell 154 that substantially surrounds and encloses the elastic or resilient core 152. The shell 154 helps to keep the elastic or resilient core 152 substantially unified and contained. In the exemplary embodiment, the shell 154 may be made out of copper (Cu). The shell 154 may have a general thickness of approximately 10 micrometers.

The solder ball 150 further comprises an electrical contact layer 156 that substantially surrounds and encloses the hard or rigid shell 154. The electrical contact layer 156 serves to allow the solder ball 150 to make a secure electrical contact to the UBM layer after the integrated circuit 100 has undergone a soldering process. In the exemplary embodiment, the electrical contact layer 156 may be made out of a lead-free Tin-Gold (Sn—Ag) material. In such a case, the ratio of Tin-to-Gold may be approximately 96.5:3.5%. Also, in the exemplary embodiment, the electrical contact layer 156 may have a general thickness of approximately 25 micrometers.

The relatively high values of elongation and mechanical strength of the organic plastic core 152 provides improved reliability and performance of chip scale packaged devices in regards to thermal-mechanical and drop-test performance of the package. These advantages may be realized specifically in packages with a relatively large bump count, such as counts exceeding a 4×4 (16 total) arrangement and up to at least a 12×12 (144 total) arrangement on a single die surface.

Figure 2:
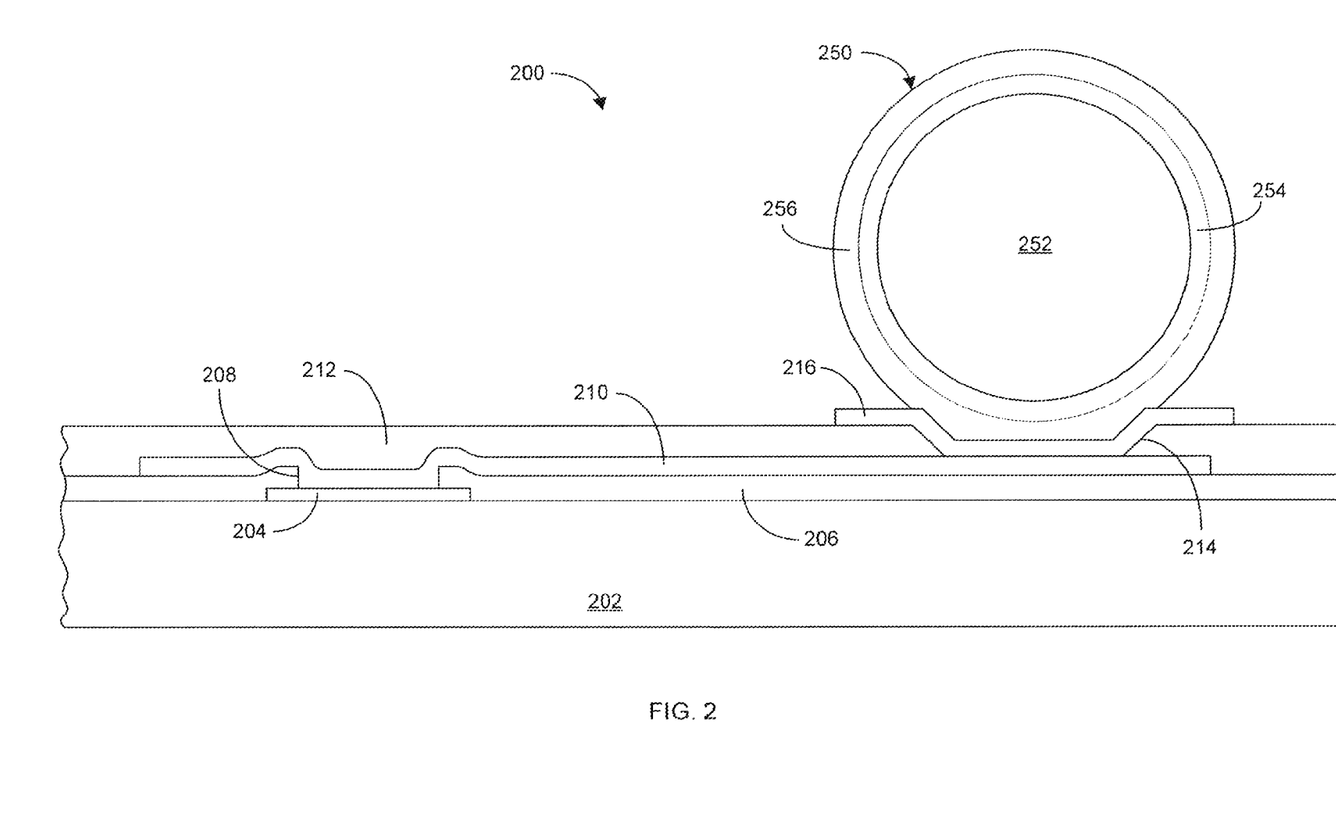
FIG. 2 illustrates a sectional view of another exemplary integrated circuit in accordance with another embodiment of the invention.

FIG. 2 illustrates a sectional view of another exemplary integrated circuit 200 in accordance with another embodiment of the invention. The integrated circuit 200 is an example of one that uses a redistribution layer (RDL) to interconnect bond pads with solder balls, such as the solder ball previously discussed. In this example, a single bond pad and respective solder bump are used to exemplify the invention. It shall be understood that the integrated circuit 200 may have a plurality of bond pads and respective solder balls in the configuration described herein.

In particular, the integrated circuit 200 comprises a semiconductor substrate 202, at least one bond pad 204 disposed over the substrate 202, and a first dielectric (passivation) layer 206 (e.g., SiO$_2$, Si$_3$N$_4$, or other) disposed over the substrate 202 and over a peripheral portion of the bond pad 204. The first dielectric layer 206 includes an opening 208 to expose at least a portion of the underlying bond pad 204. The integrated circuit 200 further comprises a redistribution layer (RDL) 210 for electrically connecting solder balls to respective bond pads. The RDL 210 allows the pattern of the solder bumps to be different than the pattern of the bond pads. The RDL 210 is disposed over the first dielectric layer 206, and the bond pad 204 through the opening 208 of the first dielectric layer 206. The RDL 210 may be comprised of any suitable electrical conductor, such as titanium-aluminum-titanium (Ti—Al—Ti).

The integrated circuit 200 further comprises a second dielectric layer 212 disposed over a portion of the first dielectric layer 206, and over a portion of the RDL 210. The second dielectric layer 212 includes an opening 214 to expose a portion of the underlying RDL 210. The second dielectric layer 212 may be comprised of PolyBenzOxazole (PBO), which allows the layer to serve additionally as a stress buffer layer to better protect the integrated circuit 200 against stress induced by, for example, the flexing of a PCB or other structure to which the integrated circuit 200 is attached. The side wall of the opening 214 of the second dielectric layer 212 may be angled (e.g., ~30 to 60 degrees) with respect to the vertical axis to provide better coverage of the underlying layers. Alternatively, or in addition to, the second dielectric layer 212 may comprise Polyimide, Benzocyclobutene (BCB), and/or other materials.

The integrated circuit 200 further comprises a UBM layer 216 to electrically interface a solder ball 250 to the RDL 210. The UBM 216 is disposed over the second dielectric layer 212, and the RDL 210 through the opening 214 of the second dielectric layer 212. A solder ball 250 is disposed over the UBM layer 216 and makes electrical contact to the bond pad 204 by way of the UBM layer 216 and RDL 210. As discussed above, the solder ball 250 may comprise an elastic or resilient core or inner layer 252 (e.g., an organic-plastic material, such as a Divinilbenzene cross-linked co-polymer of relatively high resistance), a hard or rigid shell 254 (e.g., Cu) substantially surrounding and enclosing the core or inner layer 252, and an electrical contact layer 256 (e.g., Sn—Ag) substantially surrounding and enclosing the hard or rigid shell 254.

Figure 3:
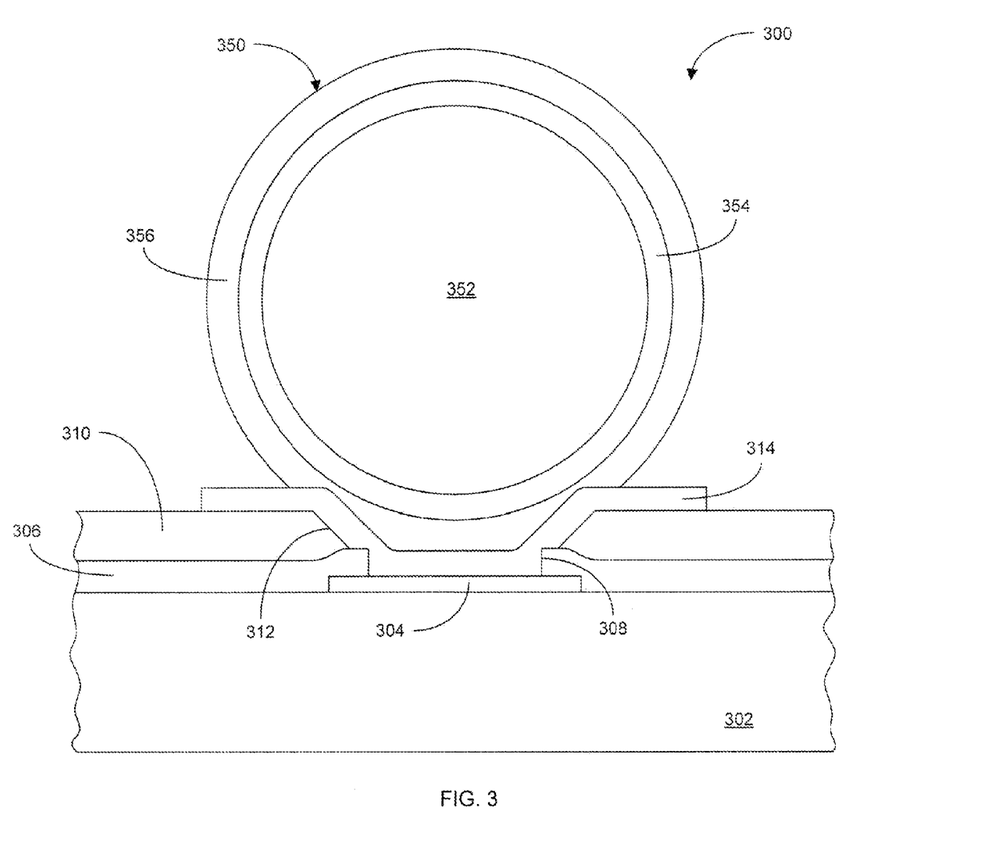
FIG. 3 illustrates a sectional view of another exemplary integrated circuit in accordance with another embodiment of the invention.

FIG. 3 illustrates a sectional view of another exemplary integrated circuit 300 in accordance with another embodiment of the invention. The integrated circuit 300 is another bump on pad (BOP) implementation that uses a PBO layer as a stress relief layer in addition to the stress-absorbing solder ball. In this example, a single bond pad and respective solder bump are used to exemplify the invention. It shall be understood that the integrated circuit 300 may have a plurality of bond pads and respective solder balls in the configuration described herein.

In particular, the integrated circuit 300 comprises a semiconductor substrate 302, a bond pad 304 disposed over the substrate 302, and a dielectric (passivation) layer 306 disposed over the substrate 302 and over a peripheral portion of the bond pad 304. The dielectric layer 306 includes an opening 308 to expose at least a portion of the underlying bond pad 304. The integrated circuit further comprises a stress relief layer 310 disposed over the dielectric layer 306. The stress relief layer 310 may be comprised of PBO, BCB, Polyimide, and/or other materials. The stress relief layer 310 includes an opening 312 defined by a side wall which may be angled (e.g., ~30 to 60 degrees) with respect to the vertical axis to provide better coverage of the underlying layers.

The integrated circuit 300 further comprises a UBM layer 314 to electrically interface a solder ball 350 to the bond pad 304. The UBM 314 is disposed over a portion of the stress relief layer 310, a peripheral portion of the dielectric layer 306 surrounding its opening 308, and a portion of the bond pad 304. A solder ball 350 is disposed over the UBM layer 314 and makes electrical contact to the bond pad 304 by way of the UBM layer 314. As discussed above, the solder ball 350 may comprise an elastic or resilient core or inner layer 252 (e.g., an organic plastic material, such as a Divinilbenzene cross-linked co-polymer of relatively high resistance), a hard or rigid shell 354 (e.g., Cu) substantially surrounding and enclosing the core or inner layer 352, and an electrical contact layer 356 (e.g., Sn—Ag) substantially surrounding and enclosing the hard or rigid shell 354.

Figure 4:
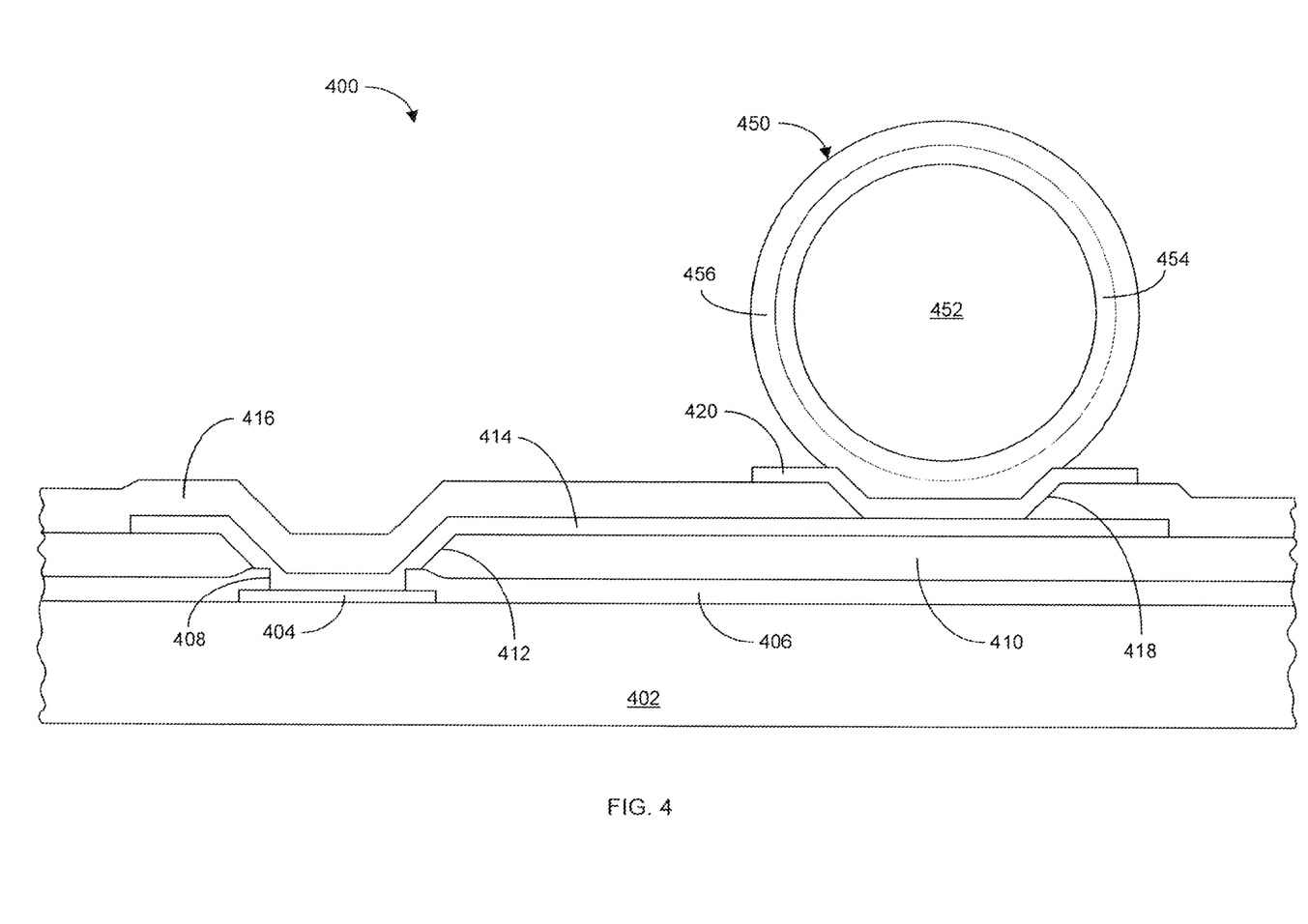
FIG. 4 illustrates a sectional view of another exemplary integrated circuit in accordance with another embodiment of the invention.

FIG. 4 illustrates a sectional view of another exemplary integrated circuit 400 in accordance with another embodiment of the invention. The integrated circuit 400 is an example of one that uses a redistribution layer (RDL) to interconnect bond pads with solder balls, such as the solder ball previously discussed. Additionally, the integrated circuit 400 is an example of one that uses two stress relief layers in addition to a stress-absorbing solder ball. In this example, a single bond pad and respective solder bump are used to exemplify the invention. It shall be understood that the integrated circuit 400 may have a plurality of bond pads and respective solder balls in the configuration described herein.

In particular, the integrated circuit 400 comprises a semiconductor substrate 402, at least one bond pad 404 disposed over the substrate 402, and a dielectric (passivation) layer 406 disposed over the substrate 402 and over a peripheral portion of the bond pad 404. The dielectric layer 406 includes an opening 408 to expose at least a portion of the underlying bond pad 404. The integrated circuit 400 further comprises a first stress relief layer 410 disposed over the dielectric layer 406. The stress relief layer 410 may be comprised of PBO, BCB, Polyimide, and/or other materials. The stress relief layer 410 includes an opening 412 defined by a side wall which may be angled (e.g., ~30 to 60 degrees) with respect to the vertical axis to provide better coverage of the underlying layers.

The integrated circuit 400 further comprises an RDL 414 for electrically connecting solder balls to respective bond pads. As previously discussed, the RDL 414 allows the pattern of the solder balls to be different than the pattern of the bond pads. The RDL 414 is disposed over a portion of the stress relief layer 410, a portion of the dielectric layer 406, and a portion of the bond pad 404 through the respective openings 412 and 408 of the stress relief and dielectric layers 410 and 406. The RDL 414 may be comprised of any suitable electrical conductor, such as titanium-aluminum-titanium (Ti—Al—Ti).

The integrated circuit 400 further comprises a second stress relief layer 416 disposed over a portion of the first stress relief layer 410, and over a portion of the RDL 414. The second stress relief 416 includes an opening 418 to expose a portion of the underlying RDL 414. The second stress relief layer 416 may be comprised of PBO, PCB, Polyimide, or other material. The side wall of the opening 418 of the second stress relief layer 416 may be angled (e.g., ~30 to 60 degrees) with respect to the vertical axis to provide better coverage of the underlying layers.

The integrated circuit 400 further comprises a UBM layer 420 to electrically interface a solder ball 450 to the RDL layer 414. The UBM layer 420 is disposed over the second stress relief layer 416, and the RDL layer 414 through the opening 418 of the second stress relief layer 416. A solder ball 450 is disposed over the UBM layer 420 and makes electrical contact to the bond pad 404 by way of the UBM layer 420 and the RDL 414. As discussed above, the solder ball 450 may comprise an elastic or resilient core or inner layer 452 (e.g., an organic plastic material, such as a Divinilbenzene cross-linked co-polymer of relatively high resistance), a hard or rigid shell 454 (e.g., Cu) substantially surrounding and enclosing the core or inner layer 452, and an electrical contact layer 456 (e.g., Sn—Ag) substantially surrounding and enclosing the hard or rigid shell 454.

Figure 5:
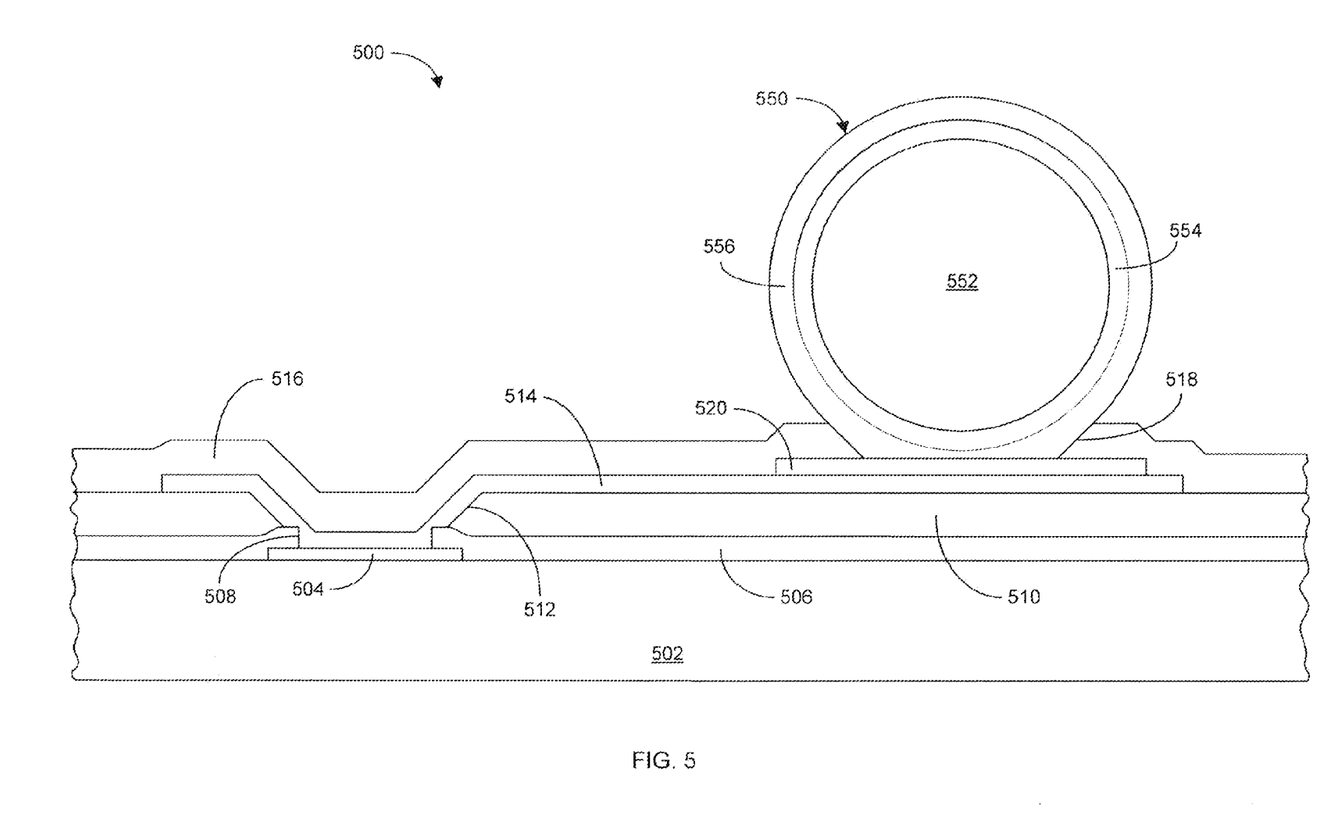
FIG. 5 illustrates a sectional view of another exemplary integrated circuit in accordance with another embodiment of the invention.

FIG. 5 illustrates a sectional view of another exemplary integrated circuit 500 in accordance with another embodiment of the invention. The integrated circuit 500 is another example of one that uses a redistribution layer (RDL) to interconnect bond pads with solder balls, such as the solder ball previously discussed. Additionally, the integrated circuit 500 is another example of one that uses two stress relief layers in addition to a stress-absorbing solder ball. In this example, a single bond pad and respective solder bump are used to exemplify the invention. It shall be understood that the integrated circuit 500 may have a plurality of bond pads and respective solder balls in the configuration described herein.

In particular, the integrated circuit 500 comprises a semiconductor substrate 502, at least one bond pad 504 disposed over the substrate 502, and a dielectric (passivation) layer 506 disposed over the substrate 502 and over a peripheral portion of the bond pad 504. The dielectric layer 506 includes an opening 508 to expose at least a portion of the underlying bond pad 504. The integrated circuit 500 further a first stress relief layer 510 disposed over the dielectric layer 506. The stress relief layer 510 may be comprised of PBO, BCB, Polyimide, and/or other material. The stress relief layer 510 includes an opening 512 defined by a side wall which may be angled (e.g., ~30 to 60 degrees) with respect to the vertical axis to provide better coverage of the underlying layers.

The integrated circuit 500 further comprises an RDL 514 for electrically connecting solder balls to respective bond pads. As previously discussed, the RDL 514 allows the pattern of the solder balls to be different than the pattern of the bond pads. The RDL 514 is disposed over a portion of the first stress relief layer 510, a portion of the dielectric layer 506, and a portion of the bond pad 504 through the respective openings 512 and 508 of the stress relief and dielectric layers 510 and 506. The RDL 514 may be comprised of any suitable electrical conductor, such as titanium-aluminum-titanium (Ti—Al—Ti).

The integrated circuit 500 further comprises a UBM layer 520 disposed over the RDL layer 514 to electrically interface a solder ball 550 to the RDL 514. The integrated circuit 500 further comprises a second stress relief layer 516 disposed over a portion of the first stress relief layer 510, over a portion of the RDL 514, and over a portion of the UBM layer 520. The second stress relief 516 includes an opening 518 to expose a portion of the underlying UBM layer 520. The second stress relief layer 516 may be comprised of PBO, PCB, Polyimide, and/or other material. The side wall of the opening 518 of the second stress relief layer 516 may be angled (e.g., ~30 to 60 degrees) with respect to the vertical axis to provide better coverage of the underlying layers.

A solder ball 550 is disposed over the UBM layer 520 through the opening 518 of the second stress relief layer 516, and makes electrical contact to the bond pad 504 by way of the UBM layer 520 and the RDL 514. As discussed above, the solder ball 550 may be comprised of an elastic or resilient core or inner layer 552 (e.g., an organic plastic material, such as a Divinilbenzene cross-linked co-polymer of relatively high resistance), a hard or rigid shell 554 (e.g., Cu) substantially surrounding and enclosing the core or inner layer 552, and an electrical contact layer 556 (e.g., Sn—Ag) substantially surrounding and enclosing the hard or rigid shell 554.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An integrated circuit, comprising:
    a substrate;
    a bond pad disposed over said substrate;
    a dielectric layer disposed over the substrate and the bond pad, the dielectric layer having an opening therein over the bond pad;
    a first stress relief layer disposed over the dielectric layer, the first stress relief layer having a second opening therein over the bond pad;
    a redistribution layer (RDL) disposed over the dielectric layer and the bond pad through the first opening and the second opening;
    an under bump metallization (UBM) layer disposed over the RDL; and
    a second stress relief layer disposed over at least a portion of the first stress relief layer, over at least a portion of the RDL, and over at least a portion of the UBM, the second stress relief layer having a third opening therein over the UBM; and
    a solder ball disposed over the UBM layer through the third opening, the solder ball including:
        an elastic or resilient layer;
        a hard or rigid layer configured to at least substantially surround and enclose the elastic or resilient layer; and
        an electrical contact layer configured to at least substantially surround and enclose the hard or rigid layer.

2. The integrated circuit of claim 1, wherein the elastic or resilient layer comprises an organic plastic material.

3. The integrated circuit of claim 2, wherein the organic plastic material comprises Divinilbenzene.

4. The integrated circuit of claim 1, wherein the elastic or resilient layer is situated at a core of the solder ball.

5. The integrated circuit of claim 1, wherein the elastic or resilient layer has a diameter of approximately 100 to 350 micrometers.

6. The integrated circuit of claim 1, wherein the electrical contact layer comprises Tin (Sn) and Gold (Ag).

7. The integrated circuit of claim 1, wherein the electrical contact layer has a thickness of approximately 25 micrometers.

8. The integrated circuit of claim 1, wherein the hard or rigid layer comprises copper (Cu).

9. The integrated circuit of claim 1, wherein the hard or rigid layer has a thickness of approximately 10 micrometers.

10. The integrated circuit of claim 1, wherein the substrate comprises a semiconductor substrate.

11. The integrated circuit of claim 1, wherein the bond pad comprises any one or more of the following: aluminum, aluminum alloy, copper, and/or copper alloy.

12. The integrated circuit of claim 1, further comprising a dielectric layer disposed over the substrate and the bond pad, wherein the dielectric layer includes an opening exposing at least a portion of the bond pad.

13. The integrated circuit of claim 12, wherein the dielectric layer comprises an oxide material and/or a nitride material.

14. The integrated circuit of claim 1, further comprising an under bump metallization (UBM) layer electrically coupling the solder ball to the bond pad.

15. The integrated circuit of claim 14, wherein the UBM layer makes direct electrical contact to the bond pad and the solder ball.

16. The integrated circuit of claim 14, wherein said UBM layer comprises any one or more of the following elements: titanium, tungsten, nickel, vanadium, or copper.

17. The integrated circuit of claim 1, wherein the RDL comprises titanium or aluminum.

18. The integrated circuit of claim 1, wherein at least one of the first stress relief layer or the second stress relief layer comprises any one or more of the following: PolyBenzOxazole, Benzocyclobutene (BCB), or Polyimide.

19. An integrated circuit, comprising:
  a substrate;
  a bond pad disposed over the substrate;
  a dielectric layer disposed over the substrate and the bond pad, wherein the dielectric layer includes an opening over the bond pad;
  a redistribution layer (RDL) disposed over the dielectric layer and the bond pad through the opening;
  an under bump metallization (UBM) layer disposed over the RDL;
  a stress relief layer disposed over at least a portion of the RDL and over at least a portion of the UBM, wherein the stress relief layer includes an opening over the UBM; and
  a solder ball disposed over the UBM layer, wherein the solder ball comprises:
    an elastic or resilient layer;
    a hard or rigid layer that substantially surrounds and encloses the elastic or resilient layer; and
    an electrical contact layer that substantially surrounds and encloses the hard or rigid layer.

20. The integrated circuit of claim 19, further comprising a stress relief layer interposed between the UBM layer and the dielectric layer.

21. An integrated circuit, comprising:
  a substrate;
  a bond pad disposed over the substrate;
  a dielectric layer disposed over the substrate and the bond pad, wherein the dielectric layer includes an opening over the bond pad;
  a first stress relief layer disposed over the dielectric layer, wherein the first stress relief layer includes an opening over the bond pad;
  a redistribution layer (RDL) disposed over the dielectric layer, and over the bond pad through the opening of the dielectric layer and the opening in the first stress relief layer;
  an under bump metallization (UBM) layer disposed over the RDL; and
  a second stress relief layer disposed over at least a portion of the first stress relief layer, over at least a portion of the RDL, and over at least a portion of the UBM, wherein the second stress relief layer includes an opening over the UBM;
  a solder ball disposed over the UBM layer through the opening in the UBM, wherein the solder ball comprises:
    an elastic or resilient layer;
    a hard or rigid layer that substantially surrounds and encloses the elastic or resilient layer; and
    an electrical contact layer that substantially surrounds and encloses the hard or rigid layer.

22. The integrated circuit of claim 19, wherein the openings in the first stress relief layer and the second stress relief layer have an angled sidewall.

23. The integrated circuit of claim 1, wherein at least one of the second opening and the third opening has an angled sidewall.

24. The integrated circuit of claim 23, wherein the angled sidewall has an angle of at least approximately thirty (30) degrees to at least approximately sixty (60) degrees.

* * * * *